(12) United States Patent
Jing et al.

(10) Patent No.: US 10,319,556 B2
(45) Date of Patent: Jun. 11, 2019

(54) ULTRA BROAD BAND CONTINUOUSLY TUNABLE ELECTRON BEAM PULSER

(71) Applicant: Euclid TechLabs, LLC, Solon, OH (US)

(72) Inventors: Chunguang Jing, Naperville, IL (US); Jiaqi Qiu, Willowbrook, IL (US); Sergey V Baryshev, Lemont, IL (US); June W Lau, Rockville, MD (US); Yimei Zhu, East Setauket, NY (US)

(73) Assignee: Euclid Techlabs, LLC, Solon, OH (US)

( * ) Notice: Subject to any disclaimer, the term of this patent is extended or adjusted under 35 U.S.C. 154(b) by 362 days.

(21) Appl. No.: 15/368,051

(22) Filed: Dec. 2, 2016

(65) Prior Publication Data

US 2017/0162361 A1   Jun. 8, 2017

Related U.S. Application Data

(60) Provisional application No. 62/262,850, filed on Dec. 3, 2015.

(51) Int. Cl.
*H01J 37/04* (2006.01)
*H01J 37/317* (2006.01)

(52) U.S. Cl.
CPC ........ *H01J 37/045* (2013.01); *H01J 37/3178* (2013.01); *H01J 2237/0432* (2013.01); *H01J 2237/065* (2013.01); *H01J 2237/2802* (2013.01)

(58) Field of Classification Search
CPC ................ H01J 37/045; H01J 37/3178; H01J 2237/0432; H01J 2237/065; H01J 2237/2802
See application file for complete search history.

(56) References Cited

U.S. PATENT DOCUMENTS 4,439,685 A   3/1984   Plies
4,721,909 A   1/1988   Richardson
(Continued)

OTHER PUBLICATIONS

T. Hosokawa, H. Fujioka, and K. Ura, Gigahertsz stroboscopy with the scanning electron microscope, 1978 American Institute of Physics, Rev. Sci. Instrum., 49(9), Sep. 1978, pp. 1293-1299, 7 pages.

(Continued)

*Primary Examiner* — Nicole M Ippolito
*Assistant Examiner* — Sean M Luck
(74) *Attorney, Agent, or Firm* — Maine Cernota & Rardin

(57) ABSTRACT

An ElectroMagnetic-Mechanical Pulser ("EMMP") generates electron pulses at a continuously tunable rate between 100 MHz and 20-50 GHz, with energies up to 0.5 MeV, duty cycles up to 20%, and pulse widths between 100 fs and 10 ps. A dielectric-filled Traveling Wave Transmission Stripline ("TWTS") that is terminated by an impedance-matching load such as a 50 ohm load imposes a transverse modulation on a continuous electron beam. The dielectric is configured such that the phase velocity of RF propagated through the TWTS matches a desired electron energy, which can be between 100 and 500 keV, thereby transferring electromagnetic energy to the electrons. The beam is then chopped into pulses by an adjustable aperture. Pulse dispersion arising from the modulation is minimized by a suppressing section that includes a mirror demodulating TWTS, so that the spatial and temporal coherence of the pulses is substantially identical to the input beam.

16 Claims, 11 Drawing Sheets

(56) References Cited

U.S. PATENT DOCUMENTS

| | | |
|---|---|---|
| 4,839,520 A | 6/1989 | Garth |
| 5,107,124 A | 4/1992 | Winkler |
| 8,569,712 B2 | 10/2013 | Knippels et al. |
| 8,710,440 B2 | 4/2014 | Kiwa |
| 9,048,060 B2 | 6/2015 | Kieft |
| 2005/0006582 A1* | 1/2005 | Steigerwald ............ H01J 37/05 250/311 |
| 2011/0168913 A1 | 7/2011 | Givon |
| 2014/0103225 A1 | 4/2014 | Kieft et al. |
| 2016/0293377 A1 | 10/2016 | Baryshev et al. |

OTHER PUBLICATIONS

A. Lassise, P.H.A. Mutsaers, and O.J. Luiten, Compact, low power radio frequency cavity for femtosecond electron, 2012 American Institute of Physics, Rev. Sci. Instrum. 83, 043705 (2012), 10 pgs.
Jiaqi Qiu, Gwanghui Ha, Chunguang Jing, Sergey V. Baryshev, Bryan W. Reed, Junw W. Lau and Yimei Zhu, GHz laser-free time-resolved transmission electron microscopy: A stroboscopic high-duty-cycle method, Ultramicroscopy 161 (2016), pp. 130-136, 6 pgs.

* cited by examiner

ULTRA BROAD BAND CONTINUOUSLY TUNABLE ELECTRON BEAM PULSER

RELATED APPLICATIONS

This application claims the benefit of U.S. Provisional Application No. 62/262,850, filed Dec. 3, 2015. This application is related to U.S. patent application Ser. No. 15/091, 639, filed Apr. 6, 2016. Both of these applications are herein incorporated by reference in their entirety for all purposes.

STATEMENT OF GOVERNMENT INTEREST

The invention was made with United States Government support. The United States Government has certain rights in this invention.

FIELD OF THE INVENTION

The invention relates to apparatus and methods for generating pulsed electron beams, and more particularly, to apparatus and methods for generating and controlling low and medium energy pulsed electron beams at very high rates.

BACKGROUND OF THE INVENTION

Generation and precise control of low and medium energy pulsed electron beams is required for many industrial, medical, and research applications, including scanning electron microscopy (SEM), transmission electron microscopy (TEM), and horizontal/vertical accelerator-based beamlines (HAB/VAB), as well as relevant experimental analytical methods that use electron beams in SEM or TEM, or HAB/VAB as probes.

In research, pulsed electron beams with ultrashort pulse durations are used for investigating dynamic processes in a variety of materials. Frequently, the electron beams are combined with other primary excitation probes such as laser beams or other photon-based probes such as X-ray beams. An example would be the "pump-probe" class of experiments.

One approach for generating electron beam pulses of a specific length and charge (i.e. intensity) in a periodic sequence is to create electron pulses directly on the surface of an electron source (cathode) by exciting the electrons using either a laser or heat combined with an external electric field.

If a laser is used as the excitation method, the sequences of electron pulses are controlled by adjusting the wavelength, power, and/or temporal structure (pulse length and repetition frequency) of the laser photon pulses. For example, if a combination of femtosecond lasers and photocathode electron emitters is used, the electron pulse lengths are strictly determined by the pulse lengths of the fs-laser and the response time of the photocathode. Using this approach, it is possible to routinely obtain pulse lengths as short as 100 femtoseconds ("fs") or less.

However, high repetition rates, defined herein as being repetition rates of at least 1 GHz or higher, are simply not available for laser-excited electron beams, because modern lasers are only capable of repetition rates on the order of 100 MHz or less (0.1 GHz or less).

In addition, it is often important in experimental systems to provide flexible and simple solutions for switching between continuous and pulsed beam modes. If the combination of a photocathode and an fs-laser is used for pulsed beam generation, then the required continuous beam must be generated using a separate thermionic or field emission source.

On the other hand, if heat combined with an external electric field is used as the excitation method, then the sequences of electron pulses are controlled by the electric field strengths and the temporal structure (pulse length and repetition frequency) of the electric field pulses.

Still another approach is to generate a continuous electron beam, and then to mechanically or electromagnetically block and unblock (i.e. "chop") the beam with a desired periodicity, according to the desired electron pulse timing in the beam sequence. Approaches that use deflecting cavity technology for chopping electron beams of tens of kV in the GHz frequency range have been known since the 1970's. However, these approaches, which typically employ just one single-cell deflecting cavity, are generally limited to pulse lengths of 1 picosecond ("ps") at best and repetition rates of 1 GHz or less, which cannot be changed or tuned. Furthermore, these approaches are only applicable for generating low energy electron beams having energies of less than 100 kilo-electron Volts ("keV"). Perhaps even more importantly, these approaches typically result in very extensive electron beam quality deterioration in both the transverse direction (beam diameter and divergence) and longitudinal direction (temporal coherence).

A combined ElectroMagnetic-Mechanical Pulser ("EMMP") is disclosed in co-pending U.S. patent application Ser. No. 15/091,639, which has been published as US-2016-029337, and in an article published in Ultramicroscopy 161 (2016) 130-136, both of which are incorporated by reference herein in their entirety for all purposes. The EMMP disclosed in these references, referred to herein as a TDC-EMMP, is a device for generating electron beams that can be pulsed at a high duty cycle with pulsing rates greater than 1 GHz and with minimal transverse and longitudinal dispersion. The TCD-EMMP uses a Transverse Deflecting Cavity ("TDC") to impose a spatial oscillation on a continuous input electron beam derived from any source. The spatially oscillating beam is then applied to an adjustable Chopping Collimating Aperture ("CCA") so as to break the beam into a series of pulses, after which a dispersion suppressing section comprising a plurality of pillbox cavity resonators, cavity resonators, and/or magnetic quadrupoles is used to suppress temporal and spatial dispersion of the pulsed beam.

Referring to FIG. 1, a conceptual diagram is shown that illustrates the fundamental concepts underlying the TCD-EMMP approach. In the illustrated approach, an initially continuous, "DC" electron beam 100 is transversely modulated into a sinusoid 110 by a vacuum-filled TDC 102 which is operated at a resonant frequency that lies within a range between 1 GHz and 10 GHz. The amplitude of the sinusoid 110 grows as the modulated beam propagates, and then the beam 110 impinges upon a chopping, collimating aperture, or "CCA" 104, having an opening 106 that is adjustable between 10 μm and 200 μm. The CCA "chops" the beam into pulses 108 that emerge from the CCA at an ultrahigh repetition rate that is twice the TDC modulation rate, because the pulses 108 are produced by cutting the sinusoid 110 of the beam modulation on both the up-swing and the down-swing. The aperture opening 106 and the modulating field of the TDC tune the pulse lengths to between 100 fs and 10 ps, resulting in duty cycles of the EMMP device of less than or equal to 20%.

After the beam 100 has been chopped into pulses 108, if nothing further were done, both the longitudinal and lateral divergence of the stream of pulses 108 would increase. In other words, the pulses would get longer (temporal divergence in the propagation or "z" direction) and would spread out (spatial dispersion in the x and y directions). So as to avoid this, as shown in FIG. 1, additional components 112, 114 are included in a divergence suppressing section downstream of the CCA 110 that reverses and suppresses this divergence. In the embodiment of FIG. 1, the divergence suppressing section includes an additional, demodulating, TDC 114, which is identical in design to the modulating TDC 102, as well as a magnetic quadrupole 112. Additional details as to the features and underlying principles of the TDC-EMMP are presented in application Ser. No. 15/091, 639, and in Ultramicroscopy 161 (2016) 130-136.

As is described in more detail in Ultramicroscopy 161 (2016) 130-136, the TDC-EMMP approach illustrated in FIG. 1 is highly effective in overcoming shortcomings that are inherent to earlier approaches, and fills an important gap in the space-time landscape of previously available devices for producing pulsed electron beams.

For example, UTEM (Ultrafast TEM) is also a stroboscopic pump-probe method, except that the pump and the probe signals are both laser-actuated. In UTEM, data are repeatedly collected over extended periods of time, and the heat that is imparted by the pump laser must be removed so that the process under study remains reversible. Therefore, even though lasers with higher repetition rates are available, UTEM systems typically operate at electron pulse rates of much less than 0.1 GHz, and sometimes even at approximately 0.1 MHz, depending on the experiment.

In addition to imaging bottlenecks for charge propagation in logic-based materials, a stroboscopic TEM based on a TDC-EMMP can also be used to image spin and chemical discontinuities in memory architectures such as spin-torque, domain-wall, and phase-change RAM, and also for studying novel interconnect materials such as nanotubes.

This class of problems, characterized by electrical stimulus and lack of an extended cool-down time, is largely distinct from the class of problems typically studied in laser-based UTEM systems. Thus, a stroboscopic TEM based on a TDC-EMMP device, by incorporating a purely electronic approach to pump/probe electron microscopy, complements existing laser-based approaches by reaching much higher repetition rates for application in the study of processes that can be so driven.

The higher repetition rates provided by TDC-EMMP devices also have an immediate advantage in terms of the amount of time required to accumulate a measured signal, because of the potential for much higher duty cycles and thus much higher time-averaged probe currents.

As an alternative to the laser-photocathode combination method of producing electron pulses, blanking of a direct current (DC) electron beam using a TDC-EMMP can produce periodic electron pulse sequences with a flexible temporal structure that can be perfectly synchronized with the clock signal driving a high-frequency nanoscale device (be it a transistor, a spin-based memory, or another such device).

The basic principle of such stroboscopic TEM is presented in FIG. 2, and its key performance parameters are presented in Table 1.

TABLE 1

| | | | |
|---|---|---|---|
| initial beam energy | | 200 keV | |
| intrinsic energy spread | | 0.5 eV | |
| dc beam current at gun exit | | ~100 nA | |
| operation mode | | stroboscopic | |
| laser | | not required | |
| pulse length | 100 fs | 1 ps | 10 ps |
| sampling rate at specimen | 10-16 GHz | 5-16 GHz | 1-16 GHz |
| duty cycle | $10^{-3} - 1.6 \times 10^{-3}$ (0.1-0.16%) | $5 \times 10^{-3} - 1.6 \times 10^{-2}$ (0.5-1.6%) | $10^{-2} - 1.6 \times 10^{-1}$ (1-16%) |
| number of electrons per cycle | ~0.1 | ~1 | ~10 |
| rms emittance | ≤0.4 nm × rad | ≤0.4 nm × rad | ≤0.4 nm × rad |
| induced rms energy spread | 0.39 eV | <0.1 eV | <0.05 eV |
| total energy spread $\sqrt{(\text{intrinsic}^2 + \text{induced}^2)}$ | 0.63 eV | <0.51 eV | ≈0.5 eV |
| total relative energy spread | $3.15 \times 10^{-6}$ | $<2.55 \times 10^{-6}$ | $\approx 2.5 \times 10^{-6}$ |
| STR at 1 nm spatial resolution | $<10^{-22}$ m · s | $<10^{-21}$ m · s | $<10^{-20}$ m · s |

In contrast, a TDC-EMMP pulsed electron source can be used to enable real-time UTEM monitoring of processes that are driven electrically, magnetically, or both, and which can be cycled indefinitely at GHz frequencies, thus enabling truly "in operando" microscopy for observing processes such as switching in a semiconductor device. For example, when studying piezoelectric field effect transistors (FETs), a timed electron beam produced using a TDC-EMMP can be used to map charge distribution directly on top of an in operando tension/compression map of the piezo material, thus providing a direct visual correlation between the effectiveness of charge transmission and the strain in crystalline lattice medium. By applying the bilayer pseudospin FET concept, advancements already made in monochromatic valence electron energy-loss spectroscopy (VEELS) can then be used to map the full path and lifetime of excitonic transitions across the semiconducting bilayers.

According to the approach illustrated in FIG. 2, an electron source 200 directs a continuous beam of electrons 202 to a TDC-EMMP 204, which produces a stream of electron pulses 206 that impinge on the device 208 that is under study. A small part of the RF signal 210 supplied to the TDC-EMMP 204 is diverted to the sample 208 through a phase-locked delay line 212, and is used to trigger a repetition of the process that is being studied. A rapid series of measurements 214 can then be obtained in real time.

Similar to UTEM, issues such as heating can be anticipated. Nevertheless, nearly in-operando examination of devices or device structures is feasible using a TDC-EMMP, since the TDC-EMMP is electromagnetically driven, so that long thermal cool-down times are typically not required. In particular, a stroboscopic microscope based on a TDC-EMMP can reveal the inner workings of advanced devices by concurrently enabling all of the high-resolution imaging, analytical, nanoscale diffraction (including strain measurements), and other capabilities (such as holographic imaging of electric fields and spectroscopic imaging of plasmonic fields combined with tomography) of a modern TEM on the timescales of the devices' normal operation.

Nevertheless, while the TDC-EMMP has many advantages, the use of a TDC to impose the spatial oscillation onto the beam imposes some inherent limitations. In particular, while the TDC has the advantage of being applicable to a continuous range of beam energies, i.e. electron velocities, it is only able to operate at a few distinct resonant frequencies. In other words, the spatial oscillation rate, and therefore the electron pulsing rate, is limited to only a few values that correspond to resonant modes of the TDC cavity. In reality TEM machines and many other applications to which the TDC-EMMP is applicable operate at a predetermined, fixed beam energy. Accordingly, many of the important applications to which the TDC-EMMP is applicable would benefit significantly from an EMMP having a highly broadband, continuously variable pulsing rate, rather than a continuously variable range of beam energies.

What is needed, therefore, is an EMMP that is able to produce a pulsed electron beam which is tunable over a wide range of pulsing frequencies (i.e. pulse repetition rates).

SUMMARY OF THE INVENTION

A novel EMMP referred to herein as a TWTS-EMMP is disclosed that is able to produce a pulsed electron beam which is continuously tunable over a wide range of pulse widths and pulsing frequencies (i.e. pulse repetition rates). As noted above, the previously introduced TDC-EMMP is limited to only a few pulse repetition rates, due to the use of a resonant cavity (TDC) as the mechanism for imposing spatial oscillations onto an electron beam. The present invention replaces this oscillation-imposing TDC with a novel Travelling Wave Transmission Stripline ("TWTS") modulator. In embodiments, the rate of electron pulses produced by the disclosed TWTS-EMMP system can be continuously adjusted between 100 MHz and 50 GHz.

The TWTS in its most general form includes an outer conductive shell filled with a dielectric, which is penetrated by a hole through which a continuous beam of electrons can be transmitted. Radio frequency energy is introduced into the device at a proximal end thereof, and propagates through the device as a traveling wave to a distal end thereof, which is terminated by a resistive load that is matched to the impedance of the device. In embodiments, the stripline has an impedance of 50 ohms, and is terminated by a 50 ohm load. Note that the terms Traveling Wave Transmission Stripline and TWTS are used exclusively herein to refer to striplines that include an internal dielectric material in addition to an outer conducting shell.

The propagation of RF through the TWTS of the present invention is similar to propagation of RF through a coaxial cable that is terminated by an impedance-matched load, and in particular the TWTS is broadband over a very wide, continuous range of RF frequencies.

It is a key property of the TWTS that the phase velocity of the RF is independent of the RF frequency, and is dependent only on the type and configuration of the dielectric. Each embodiment of the TWTS-EMMP is configured for operation at a specific electron beam energy, i.e. for a specified electron velocity. According to the present invention, the transverse mode phase velocity of the TWTS in each embodiment is tuned to match the specified electron velocity by appropriate selection and configuration of the included dielectric. In embodiments, dielectric slabs are included in the TWTS whose composition and dimensions are adjusted so as to obtain the required transvers mode phase velocity.

An additional feature of the TWTS is that the electric field of the transverse electromagnetic mode is always perpendicular to the beam propagation direction, so that the electric field of the TWTS does not contribute to the longitudinal distortion of the beam, thereby helping to preserve the energy coherence of the beam, and making it possible for embodiments to produce electron pulse lengths as short as 100 fs or less at pulse repetition rates of greater than 10 GHz.

Dispersion that is introduced by the modulation of the electron beam is suppressed in a dispersion suppressing section that is similar to dispersion suppressing sections of a TDC-EMMP, except that the demodulating TDC in the dispersion suppressing section is also replaced by a TWTS.

Devices that incorporate the disclosed TWTS-EMMP approach can provide ultra-wideband, continuous pulse rate variability in addition to all of the same benefits that are described above and in Ultramicroscopy 161 (2016) 130-136 with respect to TDC-EMMP devices.

One general aspect of the present invention is an ElectroMagnetic Mechanical Pulser ("EMMP") having an electron pulse frequency that is continuously tunable over a very wide bandwidth. The EMMP includes an input configured to accept a continuous input electron beam, a modulating Traveling Wave Transmission Stripline ("TWTS") downstream of the input having an internal passage through which the electron beam passes, the modulating TWTS being configured to impose an oscillatory transverse deflection on the electron beam according to a frequency and amplitude of a first RF energy propagated as a traveling wave through the modulating TWTS, the modulating TWTS including an internal dielectric having material properties and a physical configuration that cause a phase velocity of the first RF traveling wave to be matched to a pre-specified electron beam energy, a Chopping Collimating Aperture ("CCA") downstream of the modulating TWTS and configured to block the electron beam when its deflection exceeds a threshold maximum or minimum, thereby chopping the electron beam into a stream of electron pulses having an electron pulse repetition rate, a dispersion suppressing section downstream of the CCA, the dispersion suppressing section being configured to suppress a residual dispersion of the stream of electron pulses arising from the deflection imposed by the modulating TWTS, a demodulating TWTS included in the dispersion suppressing section, the demodulating TWTS having an internal passage through which the electron beam passes, the demodulating TWTS including an internal dielectric having material properties and a physical configuration that cause a phase velocity of a second RF energy propagated as a traveling wave through the demodulating TWTS to be matched to the pre-specified electron beam energy, the demodulating TWTS being configured to demodulate the oscillatory transverse deflection imposed on the electron beam by the modulating TWTS, and an output configured to allow the stream of electron pulses to emerge from the EMMP.

In embodiments, the EMMP is able to produce an output stream of electron pulses having an electron pulse repetition rate between 0.1 GHz and 20 GHz combined with a pulse length in the range 100 fs to 10 ps.

In any of the preceding embodiments, the EMMP can be switchable between an active mode that chops the input electron beam into the stream of electron pulses and a passive mode that passes the input electron beam through the EMMP without alteration.

In any of the preceding embodiments, the EMMP can be able to produce an output stream of electron pulses that is substantially identical to the input beam in terms of spatial and temporal coherence.

In any of the preceding embodiments, the modulating TWTS can be configured to be operated in a traveling wave transverse electromagnetic mode, and the pre-specified electron beam energy is between 100 keV and 500 keV.

In any of the preceding embodiments, the internal dielectric of the modulating TWTS can surround and be substantially parallel to the internal passage.

In any of the preceding embodiments, the internal dielectric of the demodulating TWTS can surround and be substantially parallel to the internal passage.

In any of the preceding embodiments, the internal dielectric of the modulating TWTS can have a permittivity that is substantially equal to the permittivity of quartz.

In any of the preceding embodiments, the internal dielectric of the demodulating TWTS can have a permittivity that is substantially equal to the permittivity of quartz.

In any of the preceding embodiments, each of the modulating TWTS and demodulating TWTS can be terminated by a resistive load that is impedance matched to the corresponding TWTS.

In any of the preceding embodiments, an impedance of at least one of the modulating TWTS and demodulating TWTS can be 50 ohms.

Any of the preceding embodiments can further include at least one vacuum enclosure surrounding the modulating TWTS and demodulating TWTS, the vacuum enclosure including vacuum feedthroughs for connection of at least one RF source to the modulating TWTS and demodulating TWTS.

A second general aspect of the present invention is a method of generating electron pulses having a desired pulse energy, pulse repetition rate, and pulse width. The method includes providing a modulating Traveling Wave Transmission Stripline ("TWTS") having an internal passage through which an electron beam can pass, the modulating TWTS being configured to propagate a first RF energy therethrough as a traveling wave, the modulating TWTS including an internal dielectric material, providing a Chopping Collimating Aperture ("CCA") downstream of the modulating TWTS, providing a modulation suppressing section downstream of the CCA, the modulating suppressing section including a demodulating TWTS having an internal passage through which the electron beam can pass, the demodulating TWTS being configured to propagate a second RF energy therethrough as a traveling wave, the demodulating TWTS including an internal dielectric material, adjusting at least one of a material property and a physical configuration of the internal dielectric material of each of the modulating and demodulating TWTS so as to cause a phase velocity for RF waves traveling through the modulating and demodulating TWTS to be matched to the desired electron pulse energy, causing a continuous electron beam to pass through the modulating TWTS while applying the first RF energy to the modulating TWTS, thereby imposing a spatial oscillation on the continuous electron beam, causing the spatially varied electron beam to pass through the CCA, so that the CCA blocks the electron beam when its deflection exceeds a threshold maximum or minimum, thereby chopping the electron beam into a stream of electron pulses having the desired electron pulse repetition rate, causing the electron pulses to pass through the dispersion suppressing section, adjusting an amplitude of the first RF energy, the threshold maximum of the CCA, and/or the threshold minimum of the CCA, so as to adjust widths of the electron pulses to be equal to the desired pulse width, applying the second RF energy to the demodulating TWTS, thereby suppressing a residual dispersion of the stream of electron pulses arising from the deflection imposed by the modulating TWTS, and adjusting a frequency of the first and second RF energies so that it is equal to one half of the desired pulse repetition rate.

In any of the preceding embodiments, the desired pulse repetition rate can be between 100 MHz and 50 GHz, and the desired pulse width can be in the range 100 fs to 10 ps.

In embodiments, the specified pulse energy is between 100 keV and 500 keV.

In any of the preceding embodiments, the modulating TWTS and the demodulating TWTS can both be enclosed in at least one vacuum enclosure, the vacuum enclosure including vacuum feedthroughs for connection of at least one RF source to the modulating TWTS and the demodulating TWTS, and the method further includes evacuating the vacuum enclosures.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

A novel EMMP, referred to herein as a TWTS-EMMP is disclosed that is able to produce a pulsed electron beam which is continuously tunable over a wide range of pulse widths and pulsing frequencies. As noted above, the previously introduced TDC-EMMP is limited to only certain discrete pulsing frequencies (i.e. pulse repetition rates) due to the use of a resonant cavity (TDC) as the mechanism for imposing spatial oscillations onto an electron beam. The present invention replaces this oscillation-imposing TDC with a novel Travelling Wave Transmission Stripline ("TWTS") modulator. In embodiments, the rate of electron pulses produced by the disclosed TWTS-EMMP system can be continuously adjusted between 100 MHz and 20 GHz. In still other embodiments, the TWTS-EMMP system can be continuously adjusted between 100 MHz and 50 GHz.

Figure 3:
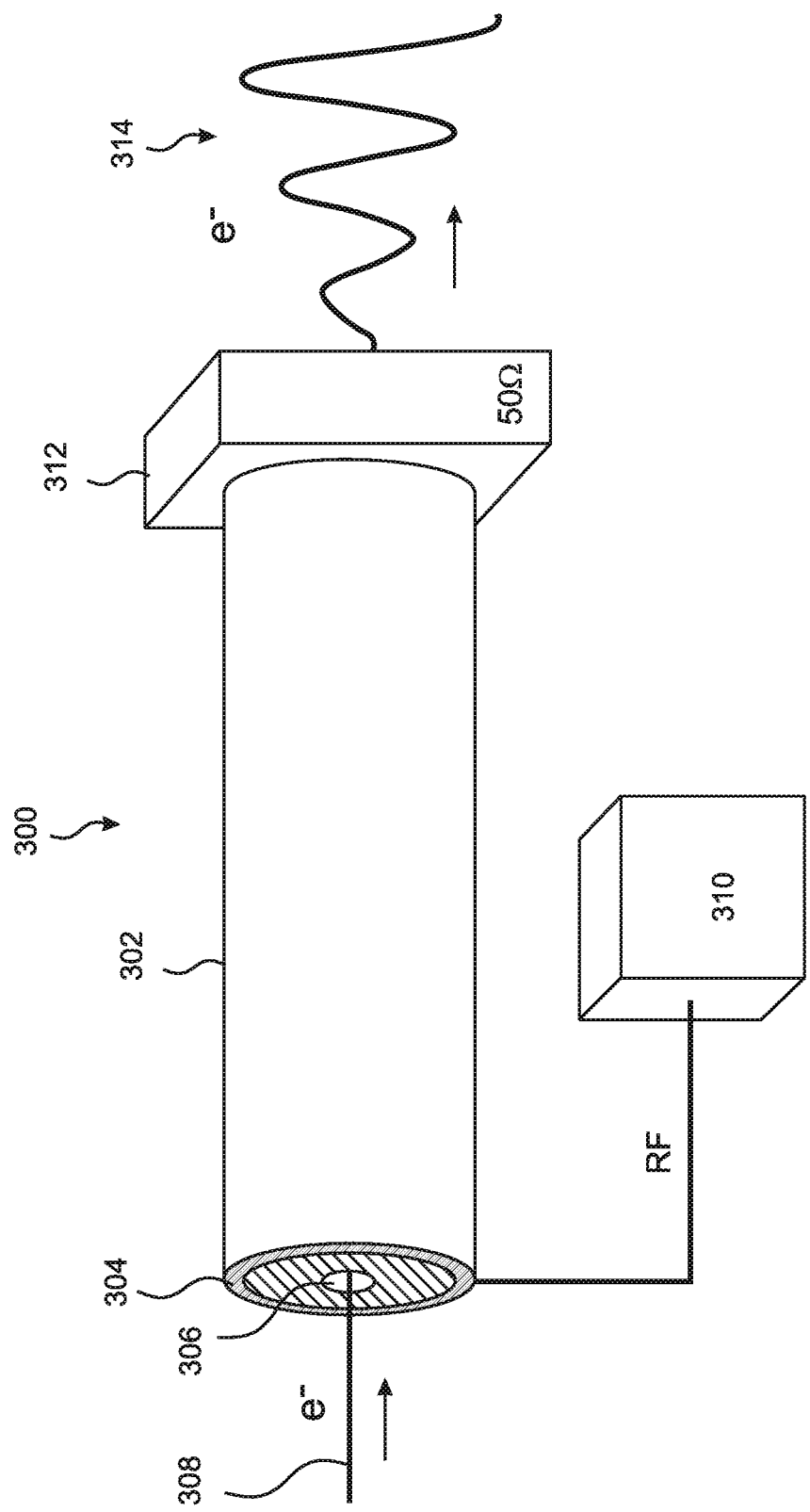
FIG. 3 is a perspective, simplified view of a TWTS-EMMP in an embodiment of the present invention.

With reference to FIG. 3, the TWTS 300 in its most general form includes an outer conductive shell 302 filled with a dielectric 304, which is penetrated by a hole 306 through which a continuous beam of electrons 308 can be transmitted. Radio frequency energy, derived in embodiments from a frequency and amplitude tunable RF source 310, is introduced into the TWTS 300 at a proximal end thereof, and propagates through the TWTS as a traveling wave to a distal end thereof, which is terminated by a resistive load 312 that is matched to the impedance of the TWTS. The transverse electric field of the RF interacts with the electron beam 308 as it passes through the TWTS 300, so that the beam 308 emerges from the distal end of the TWTS 300 as a spatially modulated beam 314. In the embodiment of FIG. 3, the stripline 300 has an impedance of 50 ohms, and is terminated by a 50 ohm load 312.

The propagation of RF through the TWTS is similar to propagation of RF through a coaxial cable that is terminated by an impedance-matched load, and in particular the TWTS is broadband over a very wide, continuous range of RF frequencies. Note that the terms Traveling Wave Transmission Stripline and TWTS are used exclusively herein to refer to striplines that include an internal dielectric material in addition to an outer conducting shell.

It is a key property of the TWTS that the phase velocity is independent of the RF frequency, and is dependent only on the type and configuration of the dielectric. Each embodiment of the TWTS-EMMP is configured for operation at a specific electron beam energy, i.e. for a specified electron velocity. According to the present invention, the transverse mode phase velocity of the TWTS in each embodiment is tuned to match the specified electron velocity by appropriate selection and configuration of the included dielectric.

If the TWTS 300 as shown in FIG. 3 did not include a dielectric 304, then the electric and magnetic forces would fully cancel each other even for electrons that passed through the TWTS 300 along the wave in the transverse electromagnetic mode at substantially the speed of light. Accordingly, it is the partial filling of the interior of the TWTS shell 302 with a dielectric 304 that avoids this total cancellation.

Furthermore, in most cases the electrons will pass through the device at a speed that is considerably slower than the speed of light. For example, the electron speed in a transmission microscope is typically about $2.1 \times 10^8$ m/s. For such slower electrons 308, it is necessary to decrease the phase velocity of the RF within the TWTS 300 so that it matches the electron velocity, thereby enabling energy to be effectively transferred from the RF wave to the electrons so as to effectively impose a spatial modulation onto the incoming dc electron beam. This is accomplished by the partial dielectric filling 304 of the beam channel 300, which functions to slow the rate at which the RF energy propagates through the TWTS 300.

An important advantage of the transverse electromagnetic mode of the TWTS is that in this mode, the phase velocity of the electromagnetic wave is independent of frequency, and is given by the equation $$v_{phase}(f) = \frac{c}{\sqrt{\varepsilon'_{eff} \times \mu_r}} = \frac{2\pi \cdot f}{k_z} = const \quad (1)$$

where $v_{phase}$ is the phase velocity; c is speed of light in vacuum; $\varepsilon'_{eff}$ is the effective dielectric constant; $\mu_r=1$ is the relative dielectric permeability; f is the RF source pump frequency; and $k_z$ is wavenumber along z-direction (a parameter inversely proportional to the RF wavelength).

For example, if the electron velocity at 200 keV is 0.695 of the speed of light, requiring a phase velocity of $2.1 \times 10^8$ m/s, then the dielectric material and its thickness can be adjusted so as to alter the effective dielectric constant of the TWTS, thereby providing the needed relationship between the wavenumber and frequency of the incoming RF signal, and resulting in the required phase velocity of $2.1 \times 10^8$ m/s.

In embodiments, dielectric slabs are included in the TWTS whose composition and dimensions are adjusted so as to obtain the required transvers mode phase velocity.

An additional feature of the TWTS is that the electric field of the transverse electromagnetic mode is always perpendicular to the beam propagation direction, so that the electric field does not contribute to the longitudinal distortion of the beam, thereby helping to preserve the energy coherence of the beam, and making it possible for embodiments to produce electron pulse lengths as short as 100 fs or less at pulse repetition rates of greater than 10 GHz.

Figure 1:
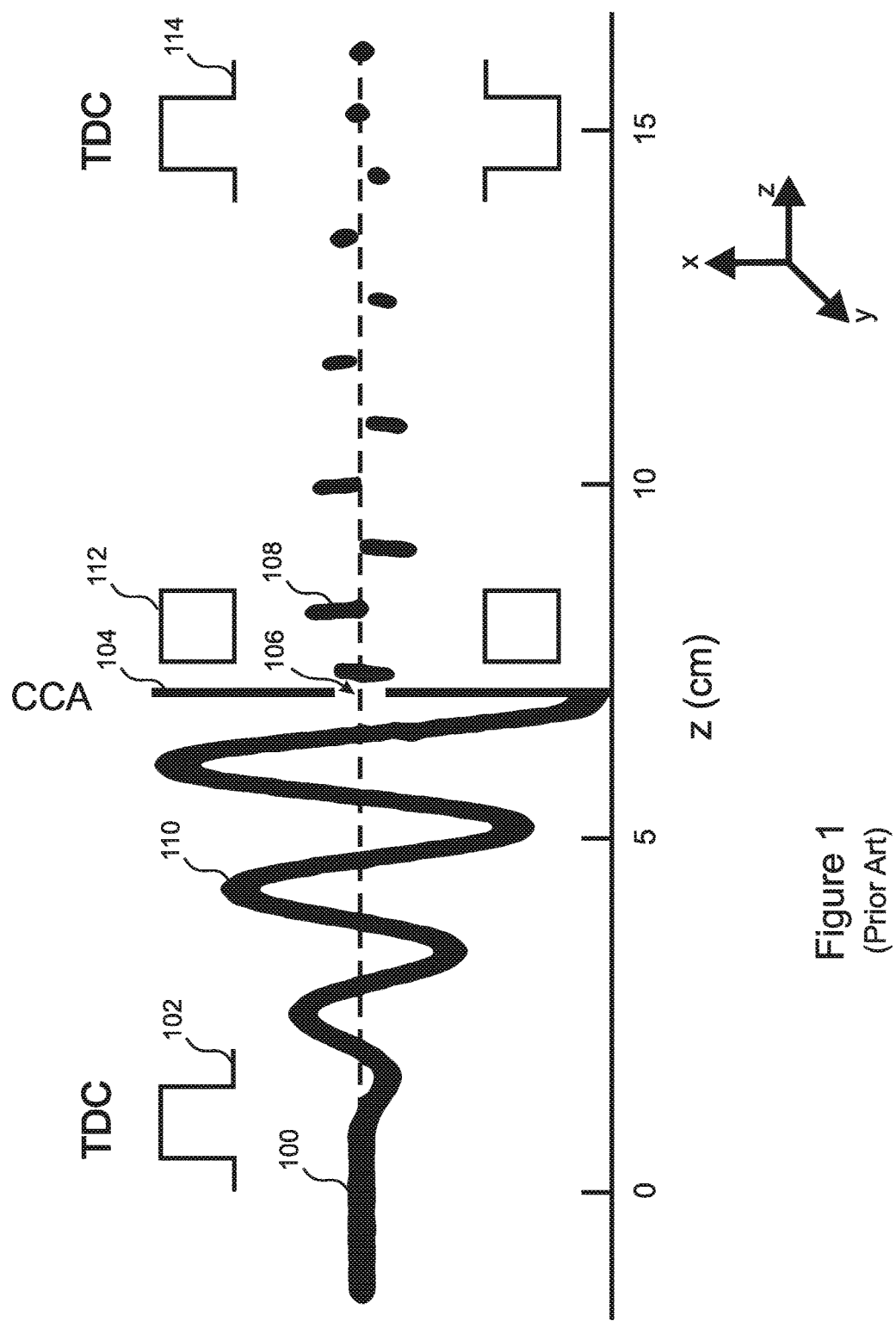
FIG. 1 is a conceptual diagram that illustrates the fundamental concepts underlying the TDC-EMMP approach of the prior art.
Figure 2:
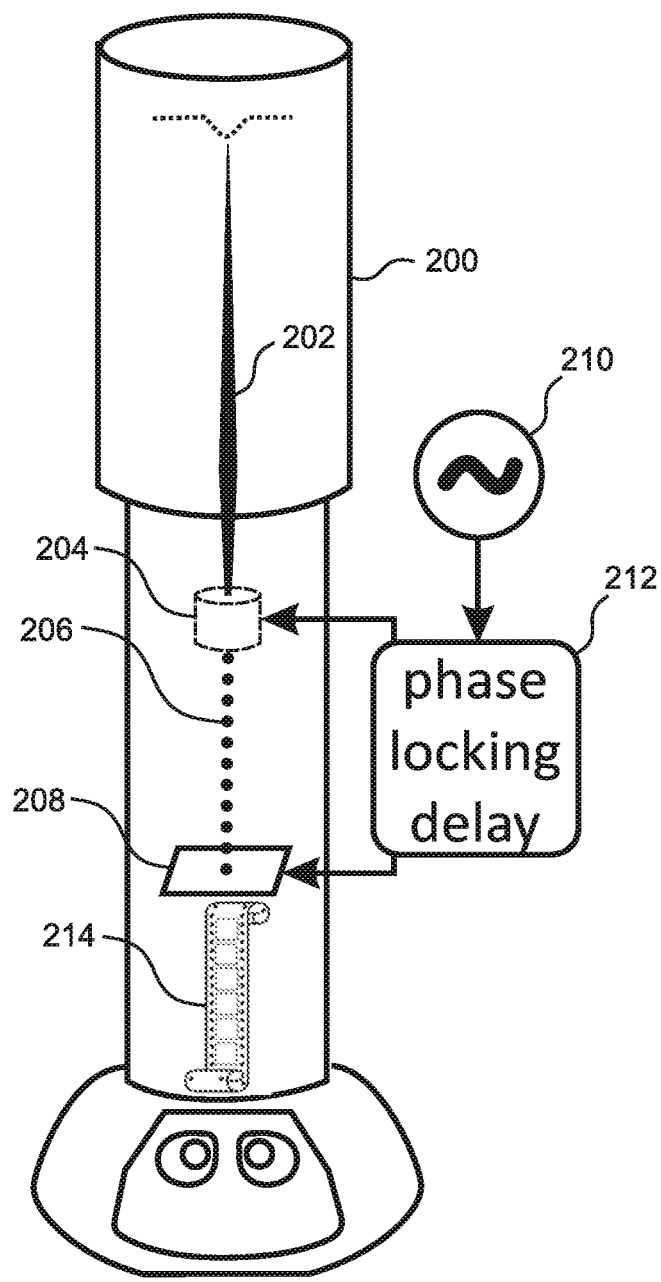
FIG. 2 is a perspective, simplified view of a TEM incorporating an embodiment of the present invention whereby a process of a device under study is triggered synchronously with the pulse rate of the EMMP.
Figure 4A:
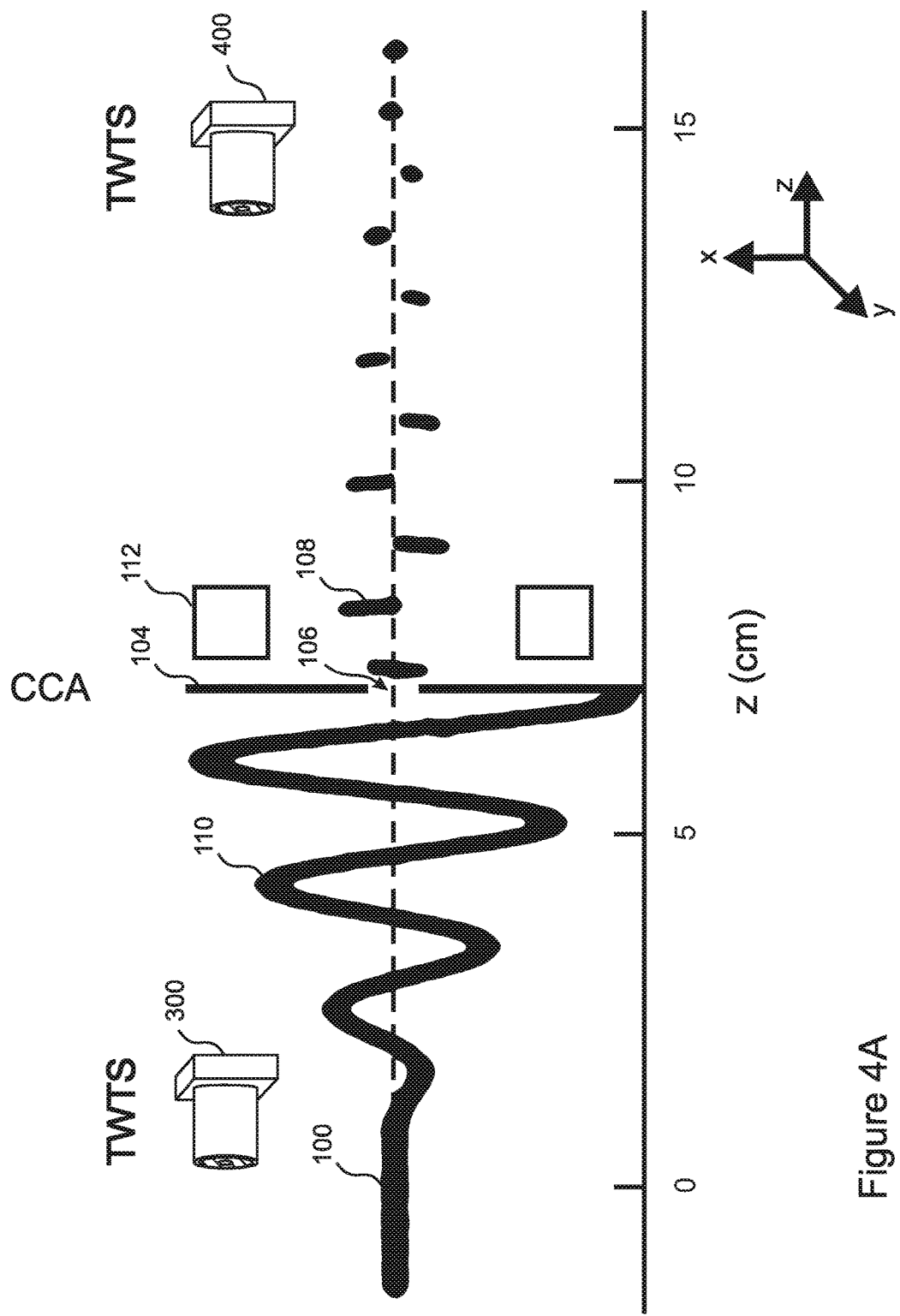
FIG. 4A is a conceptual diagram similar to FIG. 1 but including a TWTS-EMMP of the present invention.
Figure 4B:
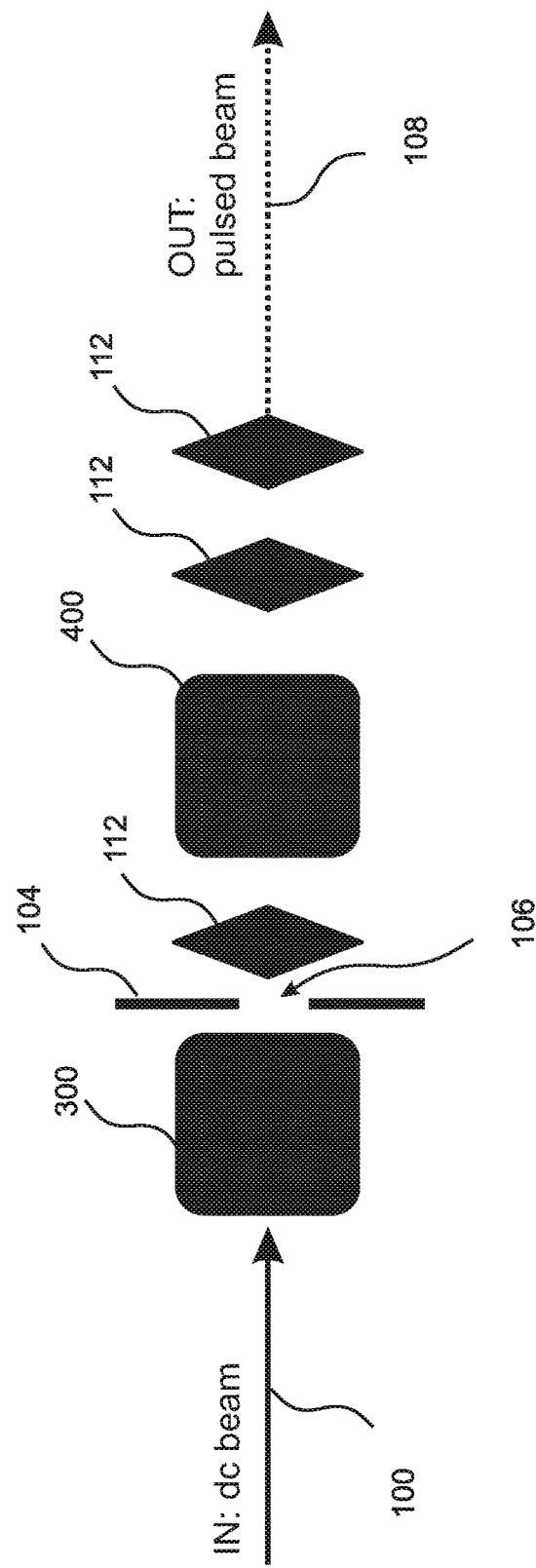
FIG. 4B is a block diagram of an embodiments similar to FIG. 1 but including three magnetic quadrupoles in the dispersion suppressing section.

With reference to FIGS. 1 and 4A, the TWTS-EMMP of the present invention is obtained by substituting the modulating TWTS 300 of FIG. 3 in place of the modulating TDC 102 of FIG. 1, and by substituting a "mirror" demodulating TWTS 400 in place of the demodulating TDC 114 of FIG. 1. A more sophisticated arrangement is illustrated in the block diagram of FIG. 4B, where the dispersion suppressing section includes three magnetic quadrupoles 112 as well as the demodulating TWTS 400.

Devices that incorporate the disclosed TWTS-EMMP approach can provide ultra-wideband, continuous pulse rate variability in addition to all of the same benefits that are described above and in Ultramicroscopy 161 (2016) 130-136 with respect to TDC-EMMP devices. The advantages of the present invention include, without limitation, that it is versatile, compact, and can be used in any of a number of devices to generate electron pulses with adjustable temporal length and repetition rate, and with excellent phase-space distribution of the beam.

Figure 5:
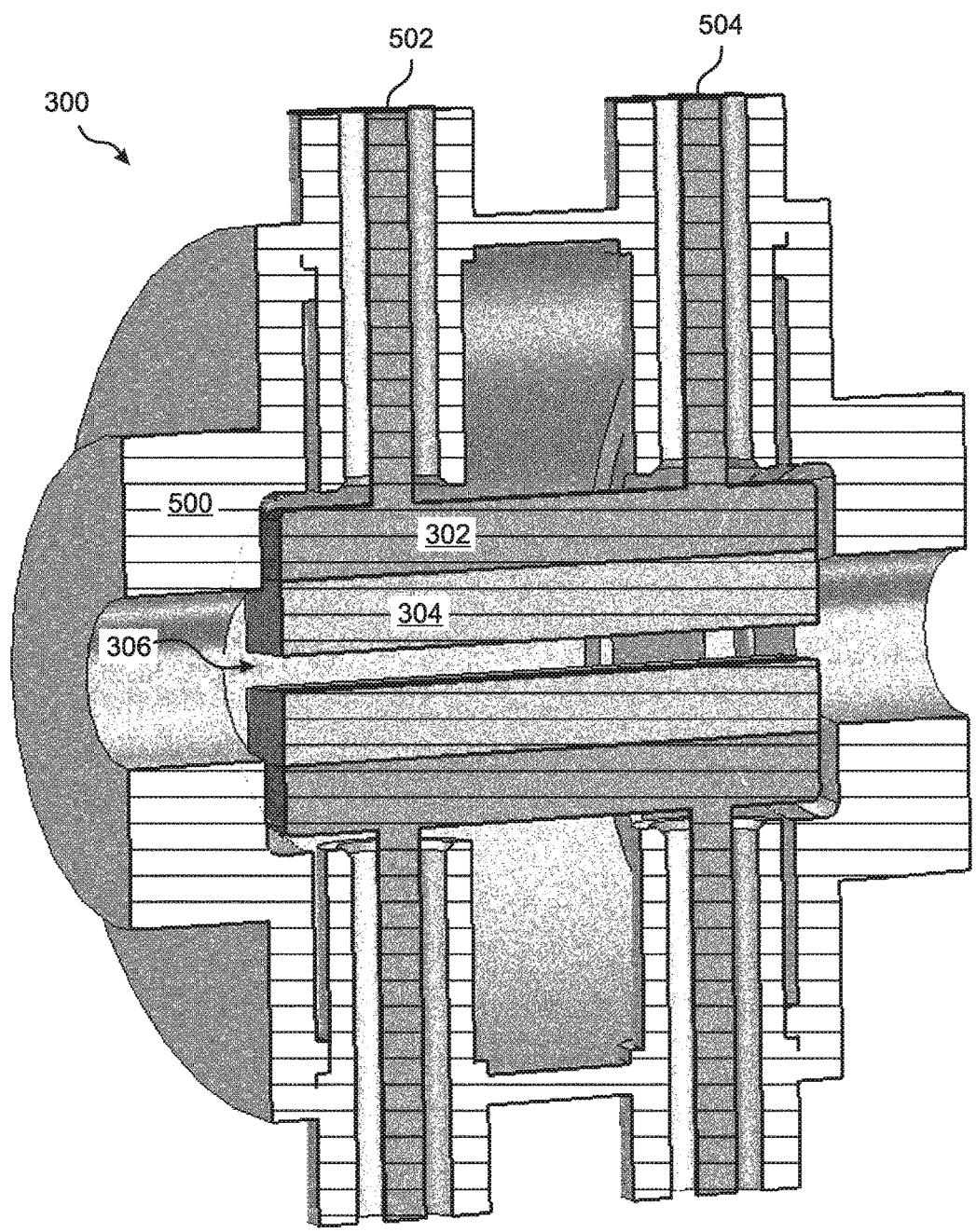
FIG. 5 is a perspective sectional view drawn to scale of a dielectric-filled TWTS in an embodiment of the present invention.

FIG. 5 is a perspective sectional view taken along a linear centerline of a dielectric-filled TWTS 300 in an embodiment of the present invention. This more detailed view of the TWTS 300 includes a vacuum chamber 500 that surrounds the conducting shell 302, as well as a first vacuum feedthrough 502 at the distal end through which the RF energy enters the TWTS 300 and a second vacuum feedthrough 504 through which the TWTS is terminated by the resistive load 312.

Figure 6A:
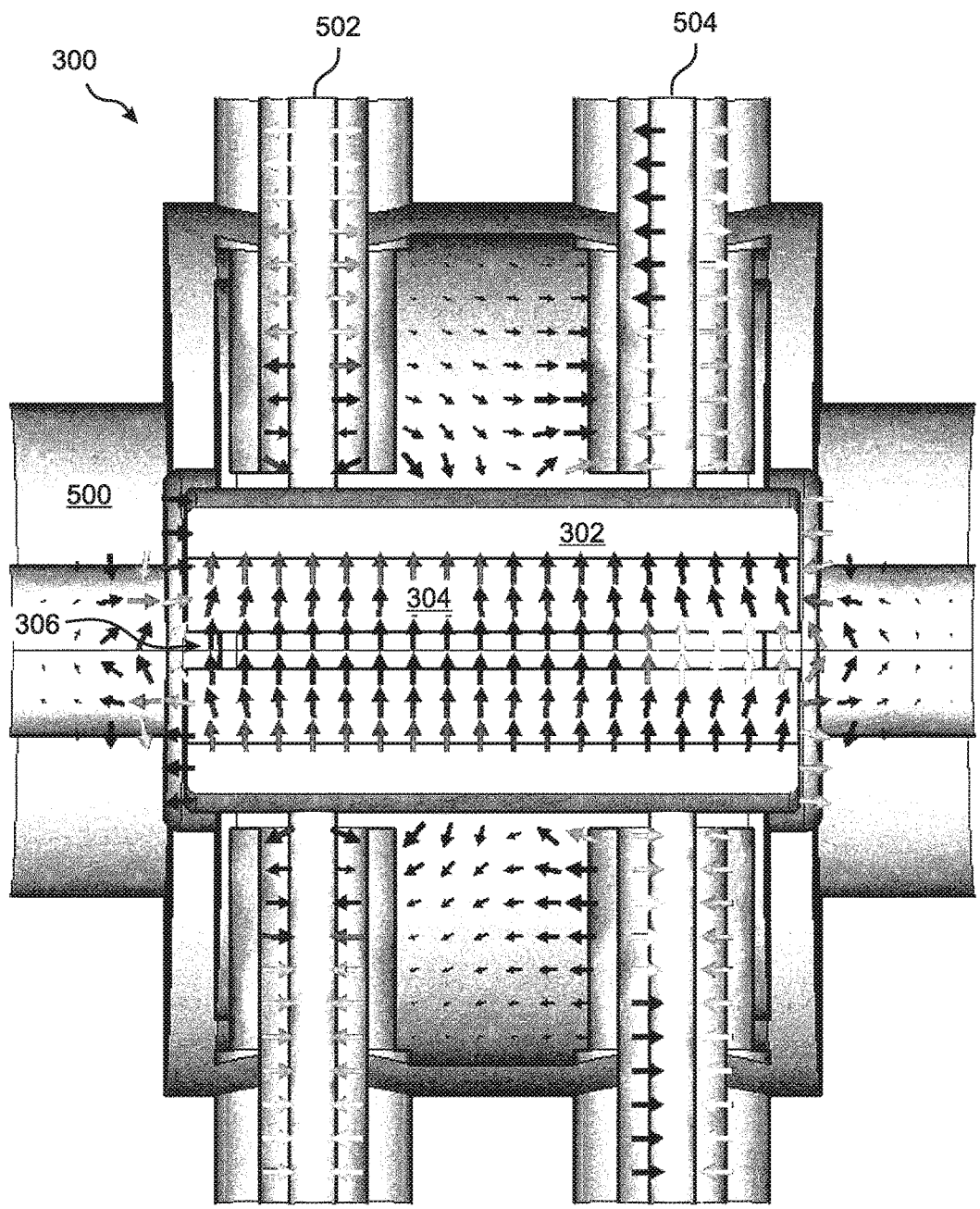
FIG. 6A is a sectional side view drawn to scale of the TWTS of FIG. 5, showing the electrical field pattern created by a traveling RF wave passing through the TWTS.
Figure 6B:
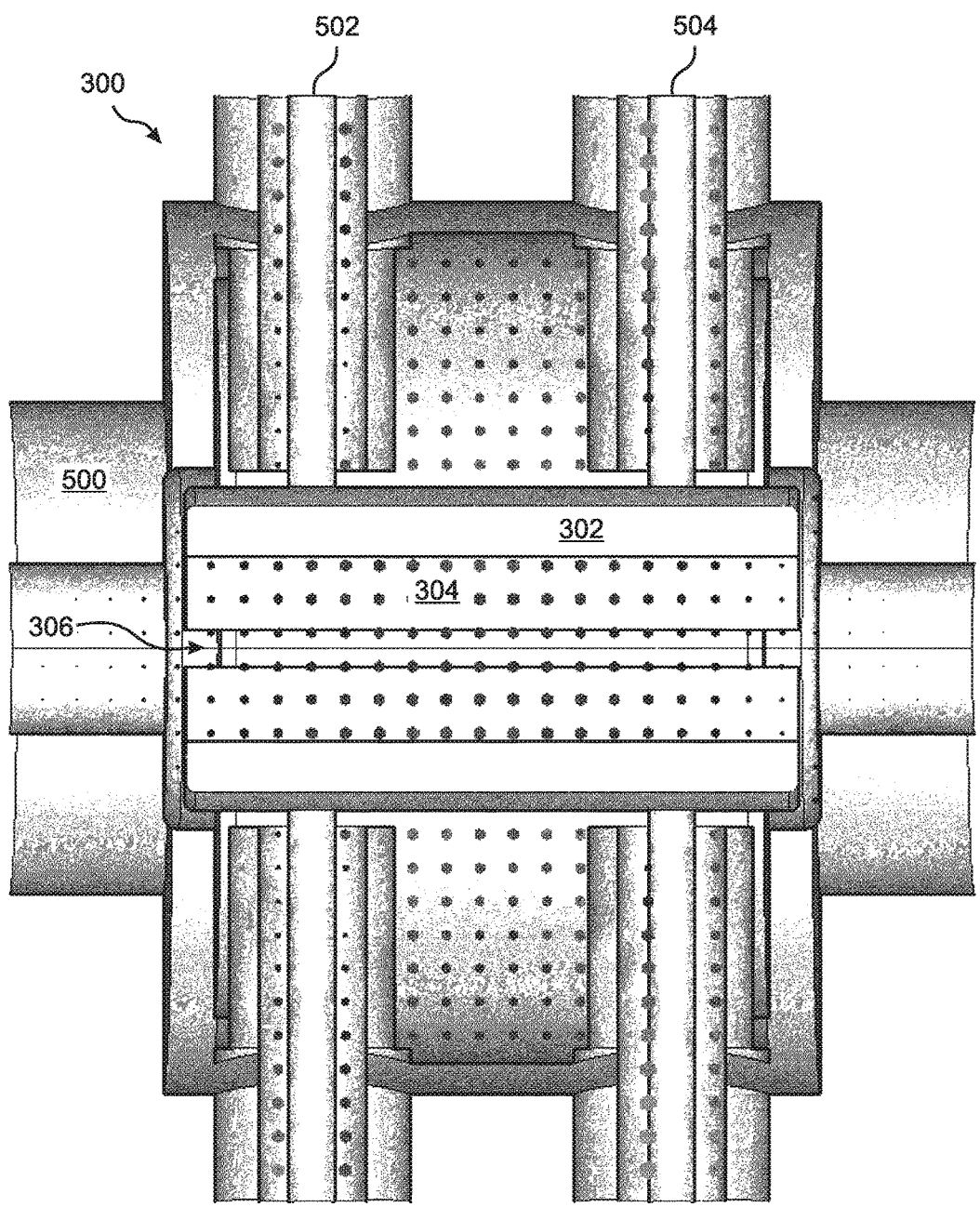
FIG. 6B is a sectional side view similar to FIG. 6A, showing the magnetic field pattern created by the traveling RF wave passing through the TWTS.

FIG. 6A is a sectional side view of the TWTS 300 of FIG. 5, showing the electrical field pattern created by a traveling RF wave passing through the TWTS 300. FIG. 6B is a sectional side view similar to FIG. 6A, showing the magnetic field pattern created by the traveling RF wave passing through the TWTS 300.

Figure 7:
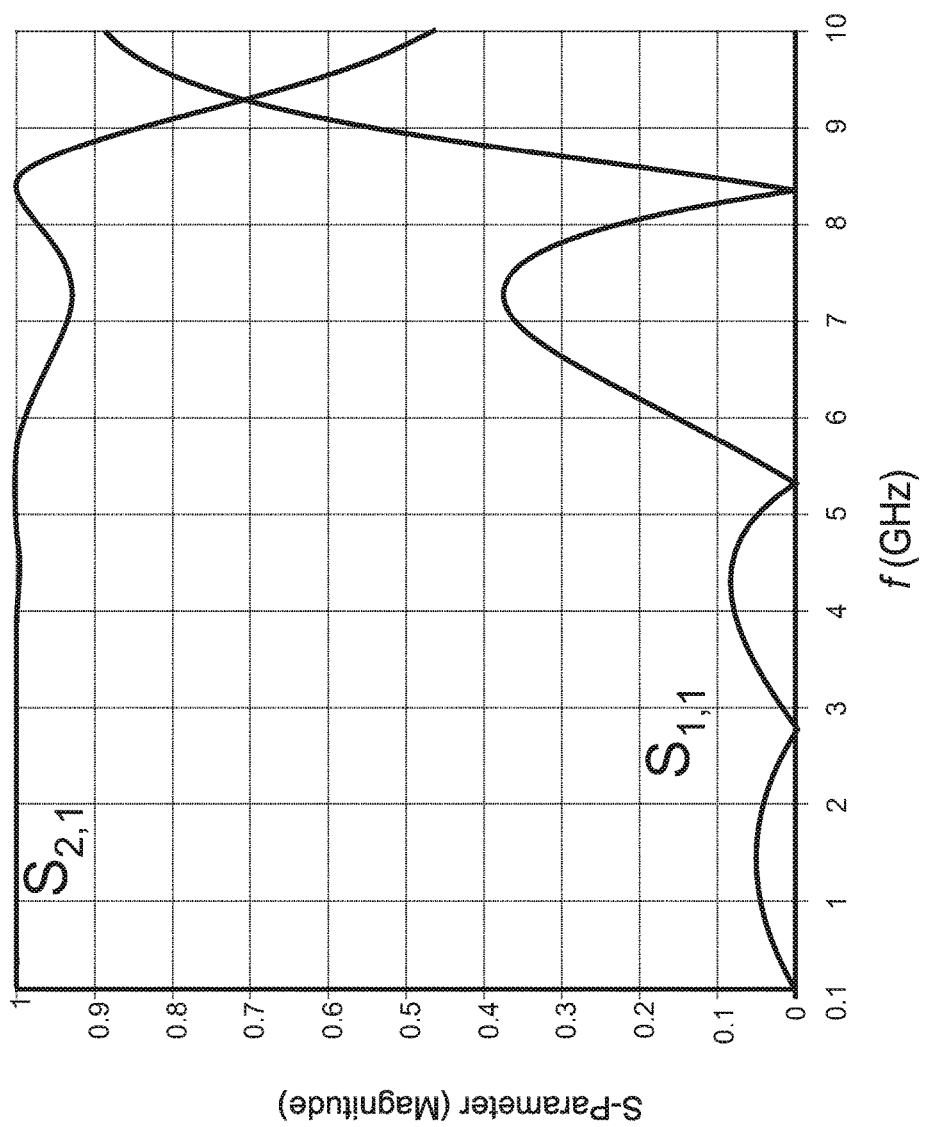
FIG. 7 is a graph of electromagnetic power transmission and reflection through a TWTS over an RF frequency range of 100 MHz to 10 GHz in an embodiment of the present invention.

FIG. 7 is a graph over a continuous frequency range from 100 MHz, to 10 GHz of electromagnetic power transmission and reflection through a TWTS in an embodiment of the present invention. The transmission and reflection are presented in terms of the S-matrix, whereby for an RF wave traveling from input port 1 to output port 2, the transmitted power is equal to the input power multiplied by $S_{2,1}$, and the reflected power is given by the input power multiplied by $S_{1,1}$.

Figure 8:
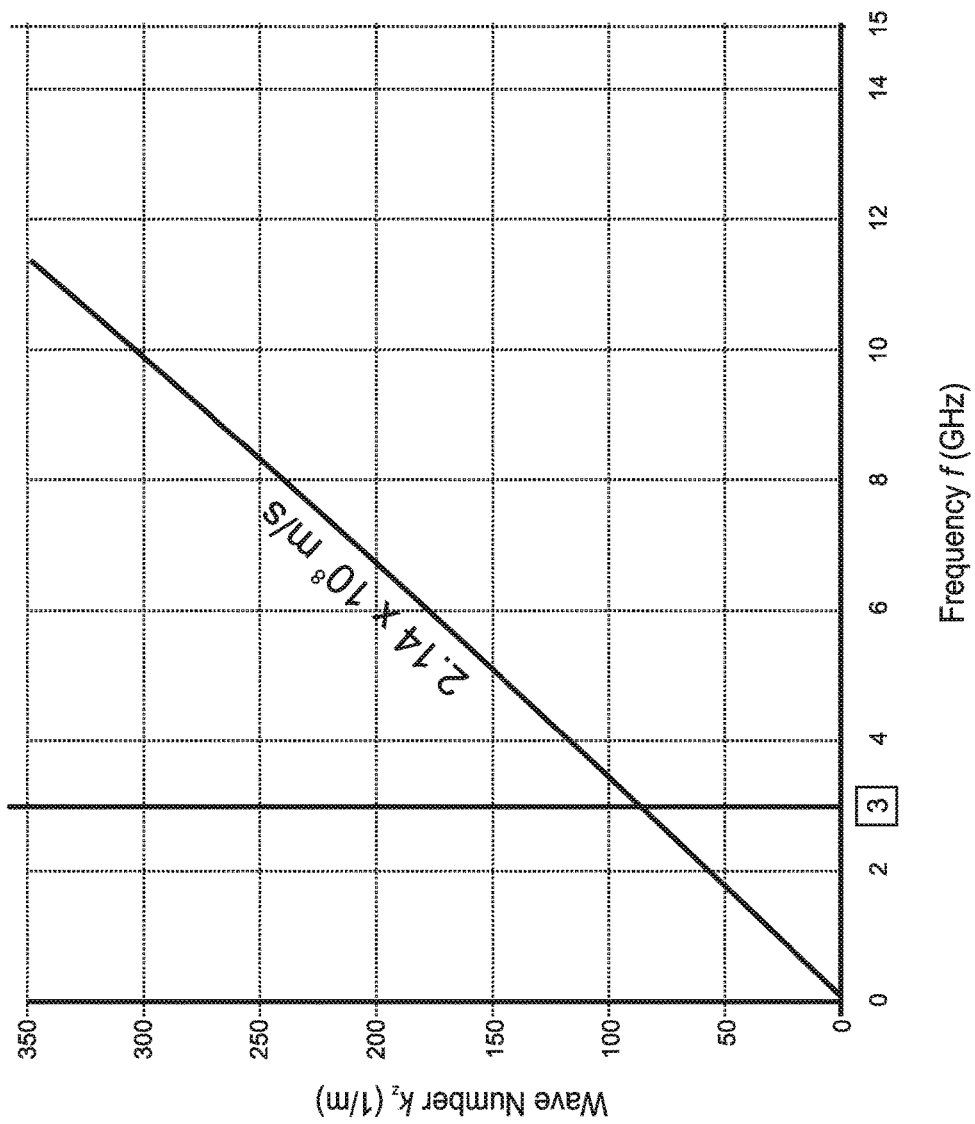
FIG. 8 is a graph that illustrates the insensitivity of phase velocity to RF frequency of an electromagnetic wave propagating through a TWTS in an embodiment of the present invention.

FIG. 8 is a graph that illustrates the phase velocity of an electromagnetic wave propagating through a TWTS in an embodiment of the present invention, showing that the phase velocity is independent of the frequency of the RF electromagnetic wave. In the example shown in the figure, the phase velocity is $2.14 \times 10^8$ m/s, which corresponds to the electron beam energy of 200 keV.

Figure 9:
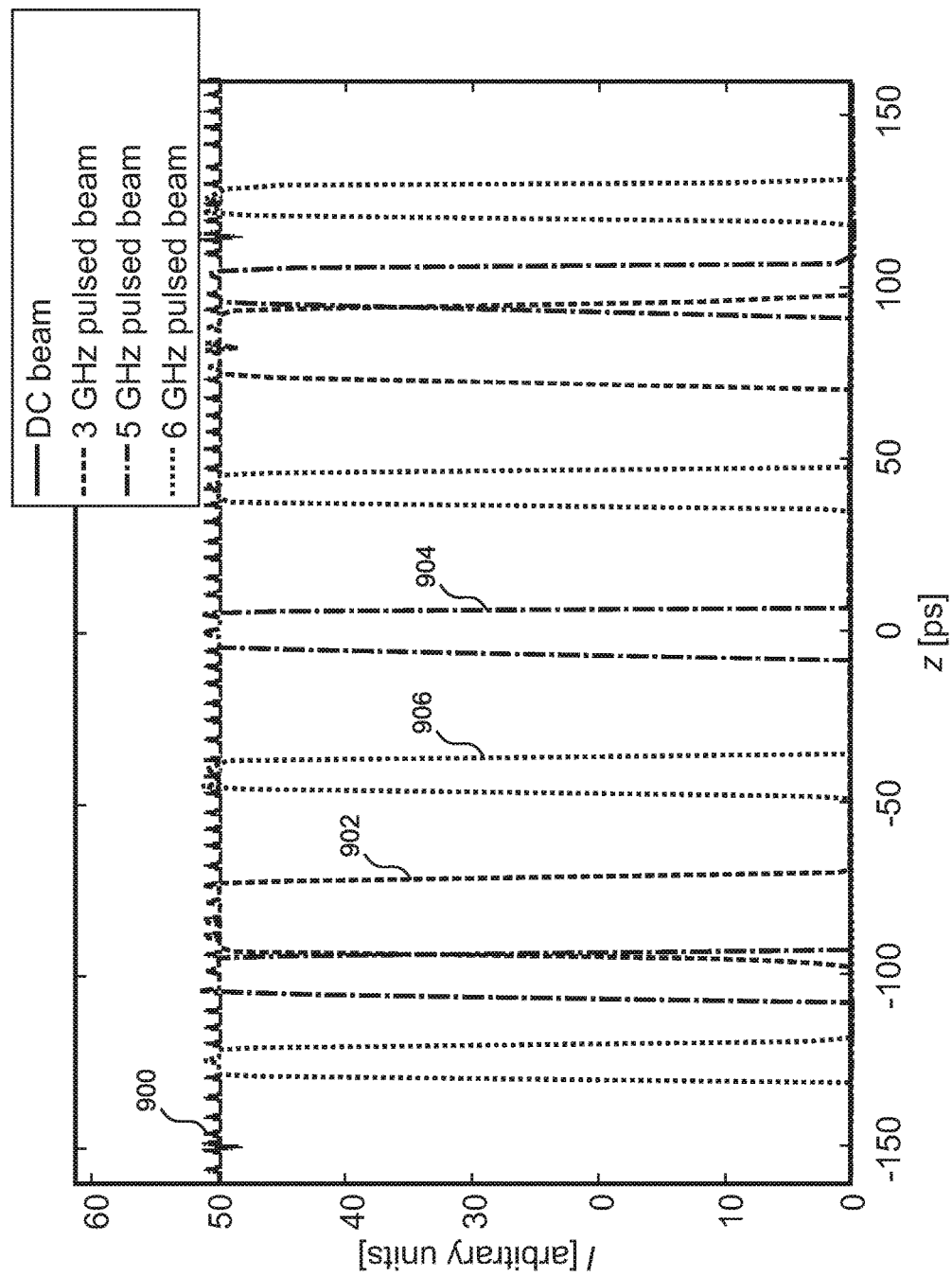
FIG. 9 is a graph that presents the results of a simulation of the input current and output current as a function of time for a TWTS-EMMP in an embodiment of the present invention.

FIG. 9 is a graph that presents the results of a simulation of the input current and output current as a function of time for a TWTS-EMMP in an embodiment of the present invention. The current amplitude I is presented in arbitrary units as a function of time, whereby the input continuous beam 900 is constant, while the output beams are pulsed at 3 GHz 902, 5 GHz 904, and 6 GHz 906, as determined by the frequencies of the RF (the chopping collimating aperture is assumed to be fixed) that is applied to the TWTS. The longitudinal, i.e. temporal, widths of the pulses can be seen from the widths of the nearly rectangular regions of current for each of the repetition rates.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application.

This specification is not intended to be exhaustive. Although the present application is shown in a limited number of forms, the scope of the invention is not limited to just these forms, but is amenable to various changes and modifications without departing from the spirit thereof. One or ordinary skill in the art should appreciate after learning the teachings related to the claimed subject matter contained in the foregoing description that many modifications and variations are possible in light of this disclosure. Accordingly, the claimed subject matter includes any combination of the above-described elements in all possible variations thereof, unless otherwise indicated herein or otherwise clearly contradicted by context. In particular, the limitations presented in dependent claims below can be combined with their corresponding independent claims in any number and in any order without departing from the scope of this disclosure, unless the dependent claims are logically incompatible with each other.

We claim:

1. An ElectroMagnetic Mechanical Pulser ("EMMP") having an electron pulse frequency that is continuously tunable over a very wide bandwidth, the EMMP comprising:
an input configured to accept a continuous input electron beam; a modulating Traveling Wave Transmission Stripline ("TWTS") downstream of the input having an internal passage through which the electron beam passes, the modulating TWTS being configured to impose an oscillatory transverse deflection on the electron beam according to a frequency and amplitude of a first RF energy propagated as a traveling wave through the modulating TWTS, the modulating TWTS including an internal dielectric having material properties and a physical configuration that cause a phase velocity of the first RF traveling wave to be matched to a pre-specified electron beam energy;
a Chopping Collimating Aperture ("CCA") downstream of the modulating TWTS and configured to block the electron beam when its deflection exceeds a threshold maximum or minimum, thereby chopping the electron beam into a stream of electron pulses having an electron pulse repetition rate;
a dispersion suppressing section downstream of the CCA, the dispersion suppressing section being configured to suppress a residual dispersion of the stream of electron pulses arising from the deflection imposed by the modulating TWTS;
a demodulating TWTS included in the dispersion suppressing section, the demodulating TWTS having an internal passage through which the electron beam passes, the demodulating TWTS including an internal dielectric having material properties and a physical configuration that cause a phase velocity of a second RF energy propagated as a traveling wave through the demodulating TWTS to be matched to the pre-specified electron beam energy, the demodulating TWTS being configured to demodulate the oscillatory transverse deflection imposed on the electron beam by the modulating TWTS; and
an output configured to allow the stream of electron pulses to emerge from the EMMP.

2. The EMMP of claim 1, wherein the EMMP is able to produce an output stream of electron pulses having an electron pulse repetition rate between 0.1 GHz and 20 GHz combined with a pulse length in the range 100 fs to 10 ps.

3. The EMMP of claim 1, wherein the EMMP can be switched between an active mode that chops the input electron beam into the stream of electron pulses and a passive mode that passes the input electron beam through the EMMP without alteration.

4. The EMMP of claim 1, wherein the EMMP is able to produce an output stream of electron pulses that is substantially identical to the input beam in terms of spatial and temporal coherence.

5. The EMMP of claim 1, wherein the modulating TWTS is configured to be operated in a traveling wave transverse electromagnetic mode, and the pre-specified electron beam energy is between 100 keV and 500 keV.

6. The EMMP of claim 1, wherein the internal dielectric of the modulating TWTS surrounds and is substantially parallel to the internal passage.

7. The EMMP of claim 1, wherein the internal dielectric of the demodulating TWTS surrounds and is substantially parallel to the internal passage.

8. The EMMP of claim 1, wherein the internal dielectric of the modulating TWTS has a permittivity that is substantially equal to the permittivity of quartz.

9. The EMMP of claim 1, wherein the internal dielectric of the demodulating TWTS has a permittivity that is substantially equal to the permittivity of quartz.

10. The EMMP of claim 1, wherein each of the modulating TWTS and demodulating TWTS is terminated by a resistive load that is impedance matched to the corresponding TWTS.

11. The EMMP of claim 1, wherein an impedance of at least one of the modulating TWTS and demodulating TWTS is 50 ohms.

12. The EMMP of claim 1, further comprising at least one vacuum enclosure surrounding the modulating TWTS and demodulating TWTS, the vacuum enclosure including vacuum feedthroughs for connection of at least one RF source to the modulating TWTS and demodulating TWTS.

13. A method of generating electron pulses having a desired pulse energy, pulse repetition rate, and pulse width, the method comprising:
- providing a modulating Traveling Wave Transmission Stripline ("TWTS") having an internal passage through which an electron beam can pass, the modulating TWTS being configured to propagate a first RF energy therethrough as a traveling wave, the modulating TWTS including an internal dielectric material;
- providing a Chopping Collimating Aperture ("CCA") downstream of the modulating TWTS;
- providing a modulation suppressing section downstream of the CCA, the modulating suppressing section including a demodulating TWTS having an internal passage through which the electron beam can pass, the demodulating TWTS being configured to propagate a second RF energy therethrough as a traveling wave, the demodulating TWTS including an internal dielectric material;
- adjusting at least one of a material property and a physical configuration of the internal dielectric material of each of the modulating and demodulating TWTS so as to cause a phase velocity for RF waves traveling through the modulating and demodulating TWTS to be matched to the desired electron pulse energy;
- causing a continuous electron beam to pass through the modulating TWTS while applying the first RF energy to the modulating TWTS, thereby imposing a spatial oscillation on the continuous electron beam;
- causing the spatially varied electron beam to pass through the CCA, so that the CCA blocks the electron beam when its deflection exceeds a threshold maximum or minimum, thereby chopping the electron beam into a stream of electron pulses having the desired electron pulse repetition rate;
- causing the electron pulses to pass through the dispersion suppressing section;
- adjusting an amplitude of the first RF energy, the threshold maximum of the CCA, and/or the threshold minimum of the CCA, so as to adjust widths of the electron pulses to be equal to the desired pulse width;
- applying the second RF energy to the demodulating TWTS, thereby suppressing a residual dispersion of the stream of electron pulses arising from the deflection imposed by the modulating TWTS; and
- adjusting a frequency of the first and second RF energies so that it is equal to one half of the desired pulse repetition rate.

14. The method of claim 13, wherein the desired pulse repetition rate is between 100 MHz and 50 GHz, and the desired pulse width is in the range 100 fs to 10 ps.

15. The method of claim 13, wherein the specified pulse energy is between 100 keV and 500 keV.

16. The method of claim 13, wherein the modulating TWTS and the demodulating TWTS are both enclosed in at least one vacuum enclosure, the vacuum enclosure including vacuum feedthroughs for connection of at least one RF source to the modulating TWTS and the demodulating TWTS, and the method further includes evacuating the vacuum enclosures.

* * * * *

UNITED STATES PATENT AND TRADEMARK OFFICE
CERTIFICATE OF CORRECTION

PATENT NO. : 10,319,556 B2
APPLICATION NO. : 15/368051
DATED : June 11, 2019
INVENTOR(S) : Chunguang Jing et al.

It is certified that error appears in the above-identified patent and that said Letters Patent is hereby corrected as shown below:

In the Specification

Replace Column 1, Lines 14-16 with the following text:
This invention was made with government support under DE-SC0013121 awarded by the U. S. Department of Energy. The Government has certain rights in the invention.

Signed and Sealed this
Sixth Day of June, 2023

Katherine Kelly Vidal
*Director of the United States Patent and Trademark Office*